(12) United States Patent
Li et al.

(10) Patent No.: US 8,110,876 B2
(45) Date of Patent: *Feb. 7, 2012

(54) SYSTEM FOR ESD PROTECTION WITH EXTRA HEADROOM IN RELATIVELY LOW SUPPLY VOLTAGE INTEGRATED CIRCUITS

(75) Inventors: Hung-Sung Li, Sunnyvale, CA (US);
Laurentiu Vasiliu, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/620,254

(22) Filed: Nov. 17, 2009

(65) Prior Publication Data

US 2010/0128403 A1    May 27, 2010

Related U.S. Application Data

(63) Continuation of application No. 11/511,210, filed on Aug. 29, 2006, now Pat. No. 7,622,775, which is a continuation of application No. 10/736,681, filed on Dec. 17, 2003, now Pat. No. 7,112,853.

(51) Int. Cl.
*H01L 29/861* (2006.01)
*H01L 23/62* (2006.01)

(52) U.S. Cl. ....... 257/357; 361/91.5; 257/355; 257/360; 257/E39.327

(58) Field of Classification Search .................... 257/357
See application file for complete search history.

(56) References Cited

U.S. PATENT DOCUMENTS

| | | | |
|---|---|---|---|
| 5,616,943 A | 4/1997 | Nguyen et al. | |
| 5,629,544 A | 5/1997 | Voldman et al. | |
| 5,796,147 A * | 8/1998 | Ono | ............................ 257/355 |
| 5,945,713 A | 8/1999 | Voldman | |
| 6,765,771 B2 * | 7/2004 | Ker et al. | ........................ 361/56 |
| 2002/0122280 A1 | 9/2002 | Ker et al. | |

* cited by examiner

*Primary Examiner* — Jerome Jackson, Jr.
(74) *Attorney, Agent, or Firm* — Sterne, Kessler, Goldstein & Fox P.L.L.C.

(57) ABSTRACT

An ESD protection system providing extra headroom at an integrated circuit (IC) terminal pad. The system includes an ESD protection circuit having one or more first diodes coupled in series between the supply voltage and terminal pad, and a second diode coupled to ground. One or more third diodes are coupled in series between the terminal pad and second diode, and are configured to permit a voltage on the interconnection nodes between the one or more third diodes and second diode different from ground. The one or more third diodes include an n+ on an area of P-substrate. A deep N-well separates the area of P-substrate from a common area of P-substrate, which is coupled to ground. The allowable signal swing at the terminal pad is increased to greater than supply voltage plus 1.4 V. The ESD protection circuit is useful for, among other things, relatively low supply voltage ICs.

20 Claims, 6 Drawing Sheets

SYSTEM FOR ESD PROTECTION WITH EXTRA HEADROOM IN RELATIVELY LOW SUPPLY VOLTAGE INTEGRATED CIRCUITS

CROSS-REFERENCE TO RELATED APPLICATIONS

This application is a continuation of U.S. patent application Ser. No. 11/511,210, filed Aug. 29, 2006, now allowed, which is a continuation of U.S. patent application Ser. No. 10/736,681, filed Dec. 17, 2003, now U.S. Pat. No. 7,112,853, both of which are incorporated herein by reference in their entireties.

BACKGROUND OF THE INVENTION

1. Field of the Invention

The present invention is related to electrostatic discharge (ESD) protection and, more particularly, to ESD protection systems in relatively low supply voltage integrated circuits (ICs).

2. Related Art

ESD protection circuits implemented at integrated circuit (IC) input/output (I/O) pads protect the ICs from unwanted ESD events, usually up to 2 kV. Typical ESD protection circuits are designed to turn off during normal operations and turn on during ESD events, and are coupled between the chip supply voltage line and ground in order to provide an adequate discharge path.

As ICs are fabricated into the sub-micron range, supply voltages are scaled down accordingly. For example, a 0.18 μm process requires a supply voltage of approximately 1.8 V, but a 0.13 μm process requires a reduced supply voltage of only 1.2 V. In low supply voltage ICs, the signal swing at the I/O pads should be as large as possible in order to maintain a sufficient signal-to-noise ratio (SNR).

A problem with ESD protection circuits in low supply voltage ICs is limited headroom at the I/O pads. Because the diodes in the ESD protection circuit must remain off during normal operations in order to prevent clipping the signal, the allowable signal swing at the I/O pads is limited. For example, a typical ESD protection circuit includes a first diode coupled between the supply voltage ($V_{DD}$) and the I/O pad, and a second diode coupled between the I/O pad and ground. Typical diodes have a forward turn-on voltage of about 0.7 V. Therefore, the diodes will remain off as long as the signal swing at the I/O pad is above $V_{DD}$ by approximately 0.7 V and below ground by about 0.7 V. The ESD protection circuit restrains the signal swing at the I/O pad to less than $V_{DD}$+1.4 V. If the signal swing at the I/O pad exceeds $V_{DD}$+1.4 V, the ESD protection circuit diodes will turn on and clip the signal, reducing linearity.

What is needed is an ESD protection system that provides extra headroom at the I/O pad in relatively low supply voltage ICs.

SUMMARY OF THE INVENTION

The present invention is directed to ESD protection systems that provide extra headroom at the terminal pad for relatively low supply voltage ICs. In an embodiment, an ESD protection system includes an ESD protection circuit having one or more first diodes coupled in series between a supply voltage and a terminal pad of an IC. The ESD protection circuit also includes a second diode coupled to ground, and one or more third diodes coupled in series between the terminal pad and the second diode. The one or more third diodes are configured to permit a voltage on interconnection nodes between the one or more third diodes and the second diode that is different from ground.

In an embodiment, the one or more third diodes of the ESD protection circuit include an n+ area on an area of IC P-substrate that is surrounded by a deep N-well. The deep N-well separates the area of IC P-substrate from a common area of IC P-substrate, which is coupled to ground. In an embodiment, the forward turn-on voltages of the one or more first diodes, the second diode, and the one or more third diodes is approximately 0.7 V. And the ESD protection circuit increases the allowable signal swing at the terminal pad to greater than the supply voltage plus 1.4 V.

Further features and advantages of the invention, as well as the structure and operation of various embodiments of the invention, are described in detail below with reference to accompanying drawings. It is noted that the invention is not limited to the specific embodiments described herein. Such embodiments are presented for illustrative purposes only. Additional embodiments will be apparent to persons skilled in the relevant arts based on the teachings contained herein.

BRIEF DESCRIPTION OF THE DRAWINGS/FIGURES

The present invention will be described with reference to the accompanying drawings. The drawing in which an element first appears is typically indicated by the leftmost digit(s) in the corresponding reference number.

DETAILED DESCRIPTION OF THE INVENTION

Overview

The present invention is directed to ESD protection systems that provide extra headroom at an IC terminal pad. In the detailed description that follows, an example environment in which the present invention can be used is identified and the preferred embodiments of the present invention are presented in detail. While specific features, configurations, and devices are discussed in detail, this description is for illustrative purposes, and persons skilled in the art will recognize that other configurations and devices can be used to achieve the features of the present invention without departing from the scope and spirit thereof.

Example Environment

Figure 1:
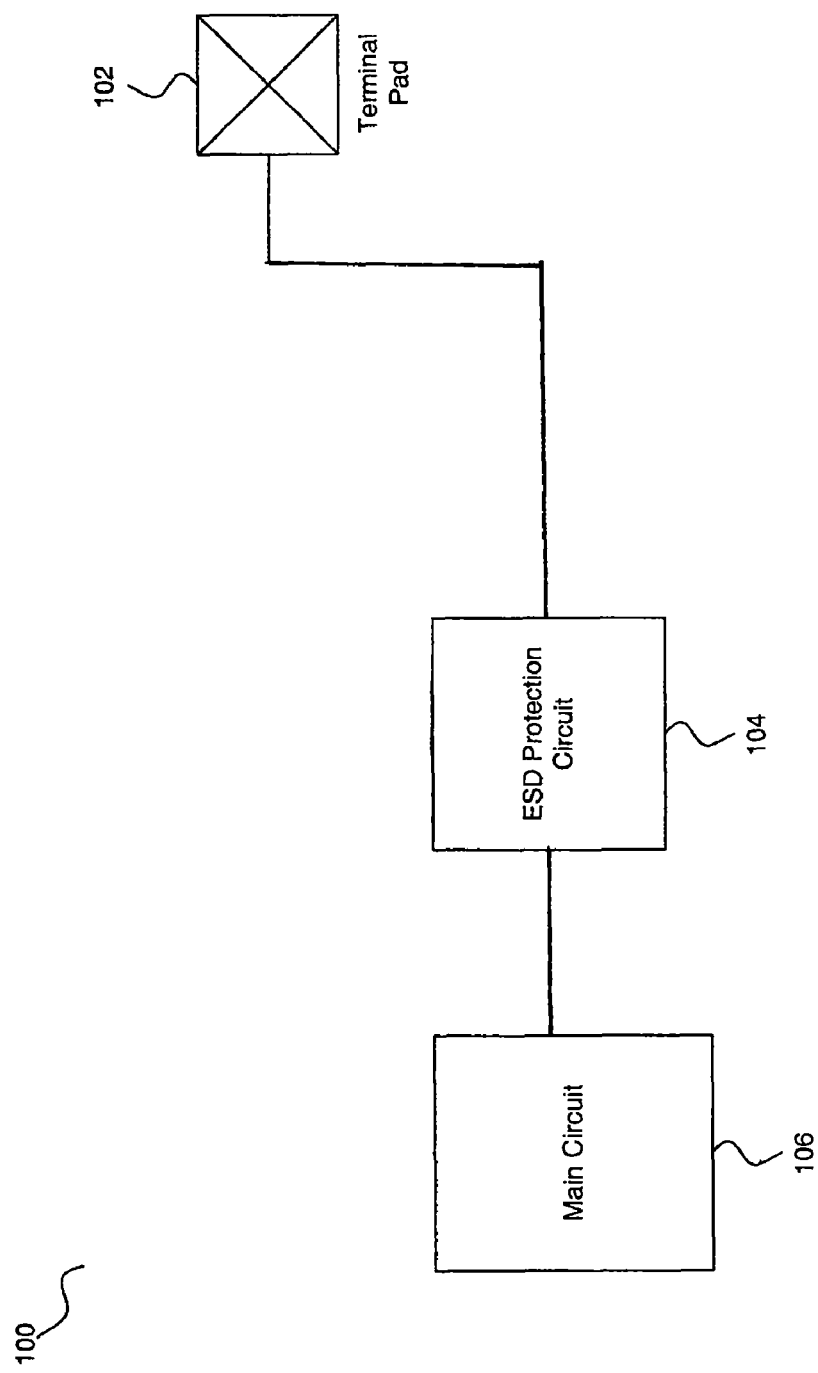
FIG. 1 illustrates an example environment in which the present invention can be used.

FIG. 1 illustrates an integrated circuit (IC) 100, in which the present invention can be used. A terminal pad 102 of IC 100 couples a main on-chip circuit 106 to off-chip devices. If terminal pad 102 is subjected to an electrostatic discharge (ESD) event, main circuit 106 can be damaged. An ESD protection circuit 104 is coupled between terminal pad 102 and main circuit 106 to redirect ESD away from main circuit 106, typically to ground.

ESD Protection System with Limited Headroom

Figure 2:
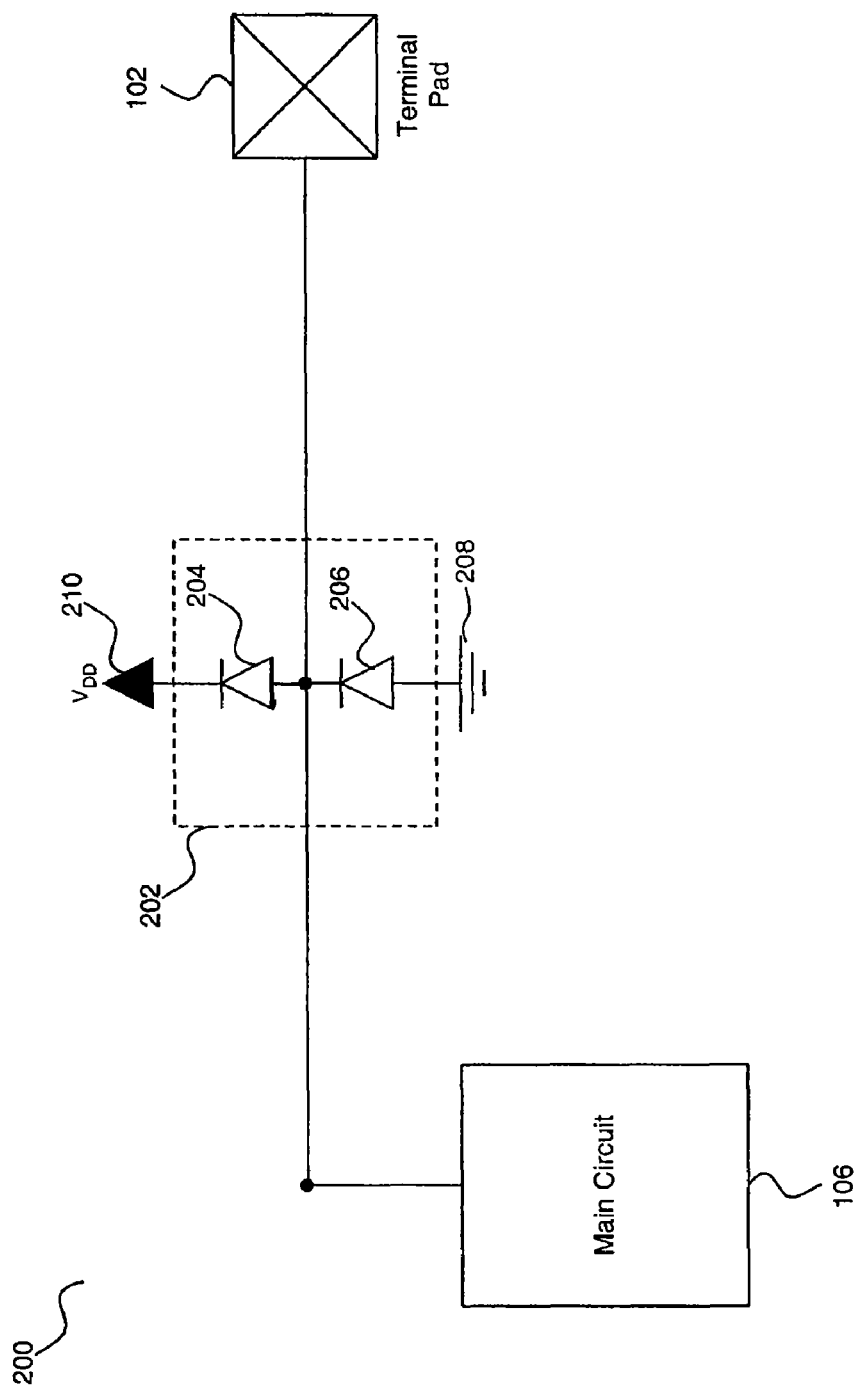
FIG. 2 illustrates a block diagram of an ESD protection system, which limits the headroom at the terminal pad for relatively low supply voltage ICs.

In order to describe preferred embodiments of the present invention, it is helpful to contrast the present invention with other approaches. For example, FIG. 2 illustrates a block diagram of an IC 200, having an ESD protection system that limits the headroom at terminal pad 102 when a supply voltage ($V_{DD}$) 210 is relatively low.

IC 200 includes an ESD protection circuit 202, which is coupled between terminal pad 102 and main circuit 106. ESD protection circuit 202 has a first diode 204 and a second diode 206. First diode 204 is coupled between supply voltage ($V_{DD}$) 210 and terminal pad 102. Second diode 206 is coupled between terminal pad 102 and a ground 208. In an embodiment, the forward turn-on voltage of first diode 204 and second diode 206 is 0.7 V. First diode 204 remains off as long as a voltage on terminal pad 102 is less than supply voltage ($V_{DD}$) 210 plus 0.7 V. Second diode 206 remains off as long as the voltage on terminal pad 102 is greater than −0.7 V. Therefore, the signal swing at terminal pad 102 is limited to less than supply voltage ($V_{DD}$) 210 plus 1.4 V. If the signal swing at terminal pad 102 is greater than supply voltage ($V_{DD}$) 210 plus 1.4 V, first diode 204 and second diode 208 will turn on and clip the signal, resulting in decreased linearity. For low supply voltage ICs, the maximum allowable signal swing at terminal pad 102 is reduced as supply voltage ($V_{DD}$) 210 is reduced. Therefore, ESD protection circuit 202 provides limited headroom at terminal pad 102 when supply voltage ($V_{DD}$) 210 is relatively low.

ESD Protection System with Extra Headroom

Figure 3:
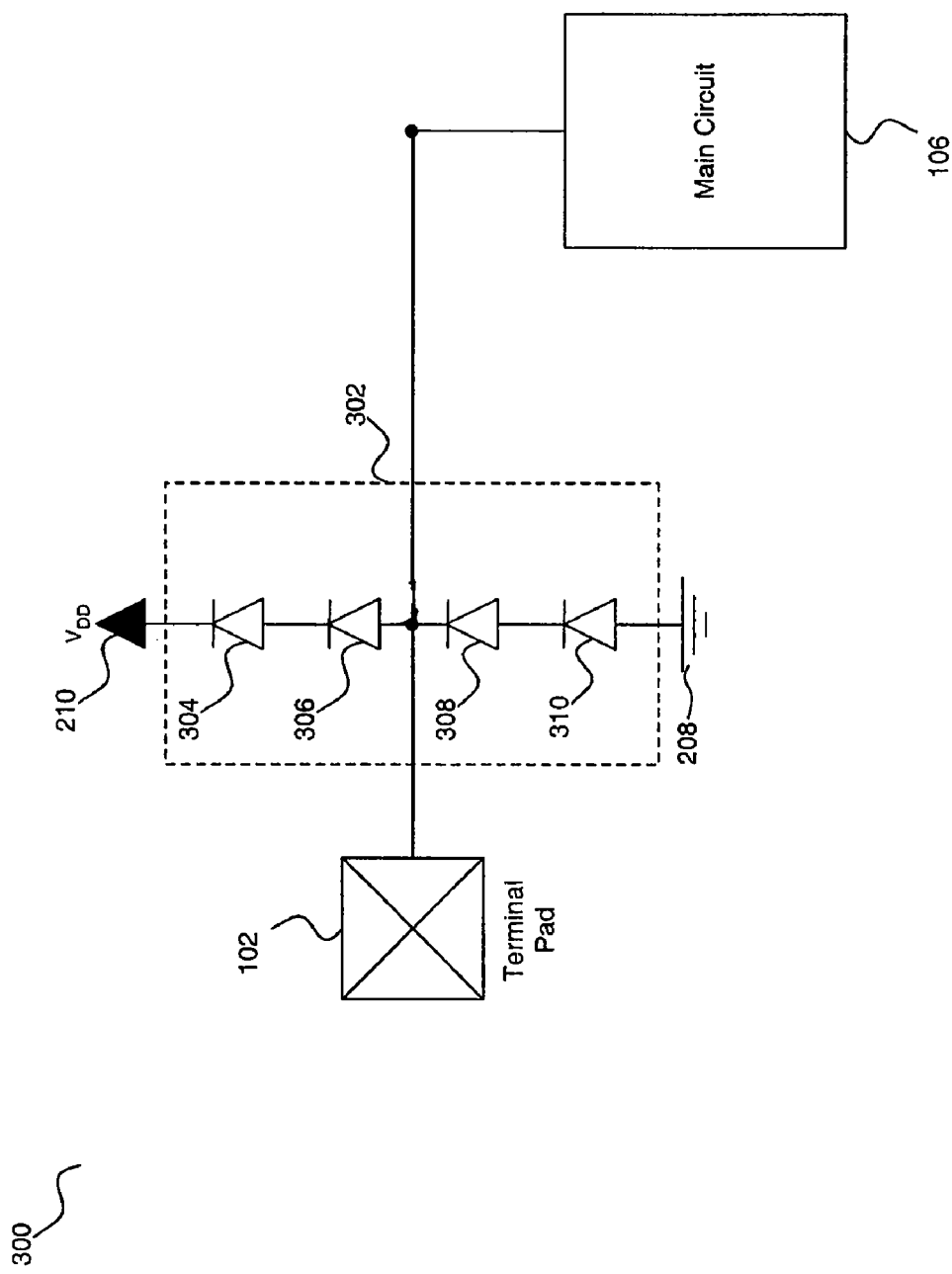
FIG. 3 illustrates a block diagram of an ESD protection system, in accordance with an embodiment of the present invention, which provides extra headroom at the terminal pad for relatively low supply voltage ICs.

A potential problem with ESD protection circuit 202 is limited headroom at the terminal pad for low supply voltages. Facilitating a larger signal swing at the terminal pad of an IC is desirable in order to maintain a sufficient SNR. FIG. 3 illustrates a block diagram of an IC 300, having an ESD protection system in accordance with an embodiment of the present invention, which provides extra headroom at terminal pad 102 when supply voltage ($V_{DD}$) 210 is relatively low.

IC 300 has an ESD protection circuit 302, which includes a first diode 304 coupled to supply voltage ($V_{DD}$) 210 and coupled in series with a second diode 306. Second diode 306 is coupled to terminal pad 102. A third diode 308 is coupled to terminal pad 102 and coupled in series with a fourth diode 310. Fourth diode 310 is coupled to ground 208. By stacking more than two diodes in series between supply voltage ($V_{DD}$) 210 and ground 208, ESD protection circuit 302 facilitates a larger signal swing at terminal pad 102 than ESD protection circuit 202, shown in FIG. 2. For example, in an embodiment of the present invention, the forward turn-on voltage of first diode 304, second diode 306, third diode 308, and fourth diode 310 is 0.7 V such that the signal swing at terminal pad 102 can be as large as supply voltage ($V_{DD}$) 210 plus 2.8 V.

Structure for Series Diodes on a Common IC Substrate Coupled to Ground

A problem with stacking multiple diodes in series on a common IC substrate is the IC substrate is coupled to ground in order to provide a common ground to the chip. Therefore, voltages other than ground at interconnection nodes between the diodes coupled in series between the terminal pad and a diode coupled to ground are prevented, and the terminal pad is potentially loaded with a large parasitic cap.

Figure 4:
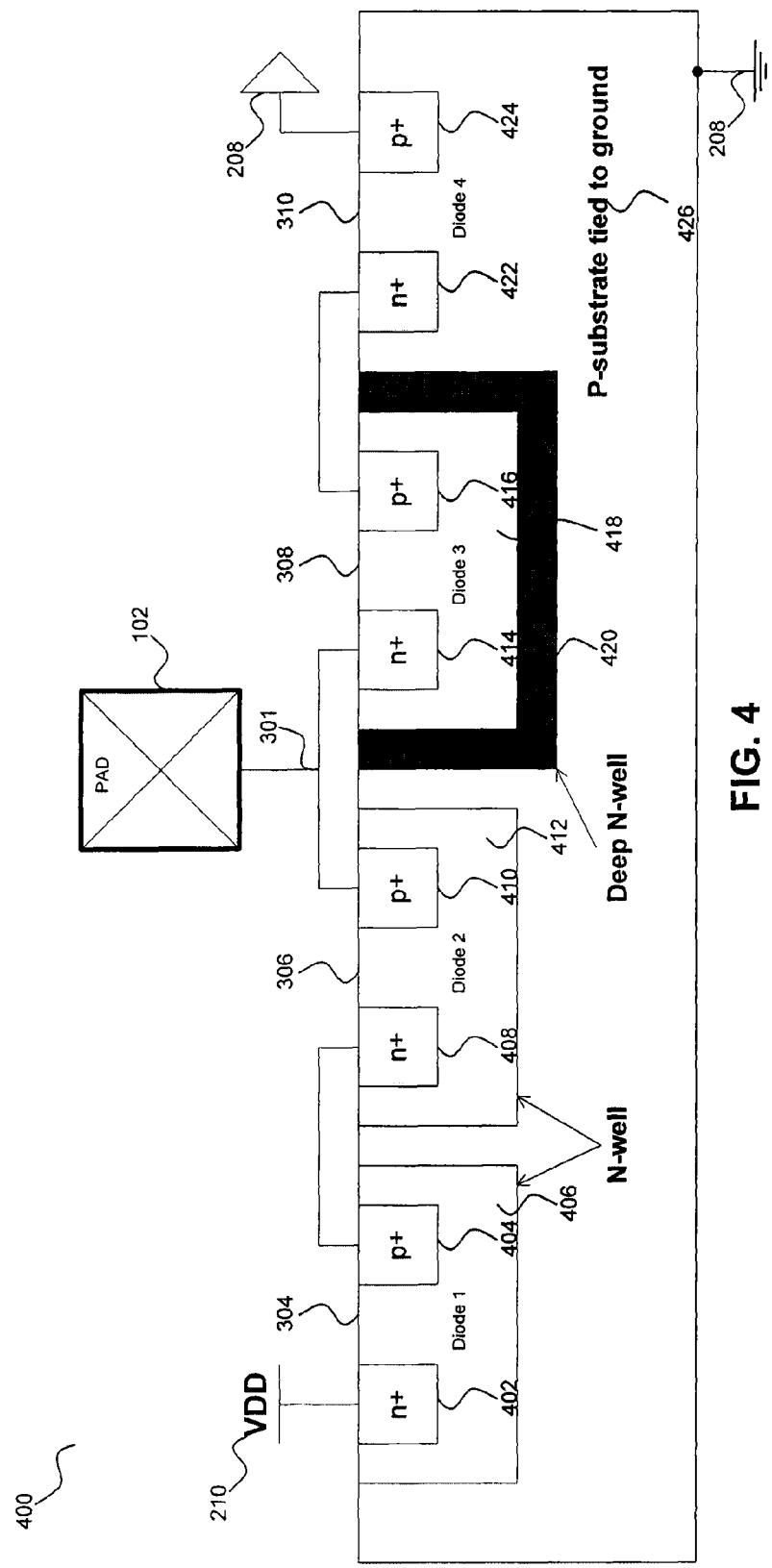
FIG. 4 illustrates a block diagram of diode structures for an ESD protection circuit, in accordance with an embodiment of the present invention, enabling multiple series diodes on a common IC substrate coupled to ground.

FIG. 4 illustrates a block diagram of diode structures for ESD protection circuit 302, shown in FIG. 3, in accordance with an embodiment of the present invention. The diode structures in the example of FIG. 4 enable stacking multiple diodes in series on a common IC substrate coupled to ground, while maintaining voltages different from ground at interconnection nodes between the diodes coupled in series between the terminal pad and a diode coupled to ground. In the example of FIG. 4, first diode 304 has a cathode 402 coupled to supply voltage ($V_{DD}$) 210 and an anode 404 coupled to a cathode 408 of second diode 306. Second diode 306 has an anode 410 coupled to terminal pad 102. First diode 304 and second diode 306 have similar structure and are formed by p+ in an N-well 406 and 412, respectively.

Third diode 308 has a cathode 414 coupled to terminal pad 102 and an anode 416 coupled to a cathode 422 of fourth diode 310. Fourth diode 310 has an anode 424 coupled to ground 208. Third diode 308 and fourth diode 310 have different structures from first and second diodes 304 and 306. Third and fourth diodes 308 and 310 are formed by n+ on P-substrate. Fourth diode 310 is formed on a first area of P-substrate 426 that is common to an IC 400 and coupled to ground 208. Third diode 308 is formed on a second area of P-substrate 418 that is separated from first area of P-substrate 426 by a deep N-well 420.

Deep N-well 420 isolates P-well pocket 418 and enables an interconnection voltage between cathode 416 of third diode 308 and anode 422 of fourth diode 310 that is different from ground 208. If third diode 308 had the structure of first and second diodes 304 and 306, terminal pad 102 would be loaded with a large N-well to P-substrate parasitic cap, potentially causing third diode 308 to turn on in response to a low signal at terminal pad 102.

The embodiment illustrated in FIG. 3-4 is one configuration of ESD protection system that provides extra headroom at the IC terminal pad. Additional configurations can be implemented using more or less diodes coupled in series at an IC terminal pad so long as at least three diodes are coupled in series between the supply voltage and ground.

Figure 5A:
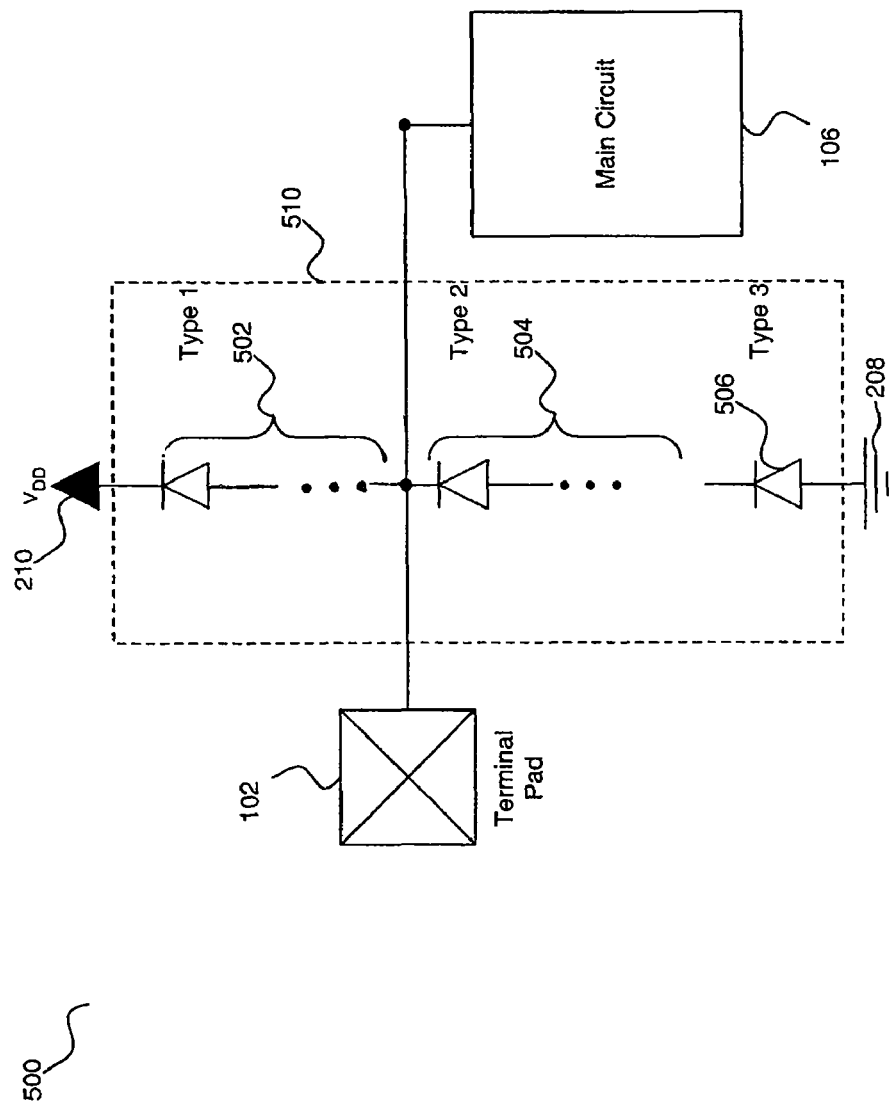
FIG. 5A illustrates a block diagram of an ESD protection system, in accordance with an embodiment of the present invention, which provides extra headroom at the terminal pad for relatively low supply voltage ICs.

For example, FIG. 5A illustrates a block diagram of an IC 500 having an ESD protection system, in accordance with an embodiment of the present invention, which has at least three diodes coupled in series between supply voltage ($V_{DD}$) 210 and ground 208. IC 500 includes an ESD protection circuit 510 having one or more of a first diode structure 502 coupled in series between supply voltage ($V_{DD}$) 210 and terminal pad 102. ESD protection circuit 510 also includes one or more of a second diode structure 504 coupled in series between terminal pad 102 and a third diode structure 506, which is coupled to ground 208.

Figure 5B:
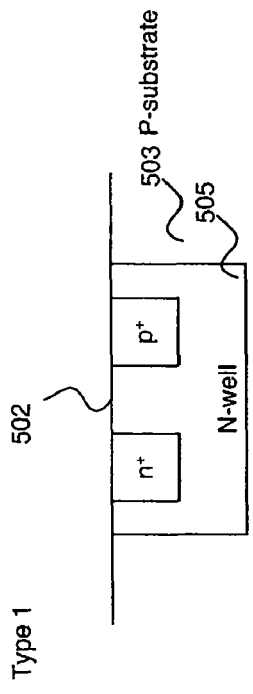
FIG. 5B-5D illustrate example implementations of diode structures for the ESD protection system illustrated in FIG. 5A.
Figure 5C:
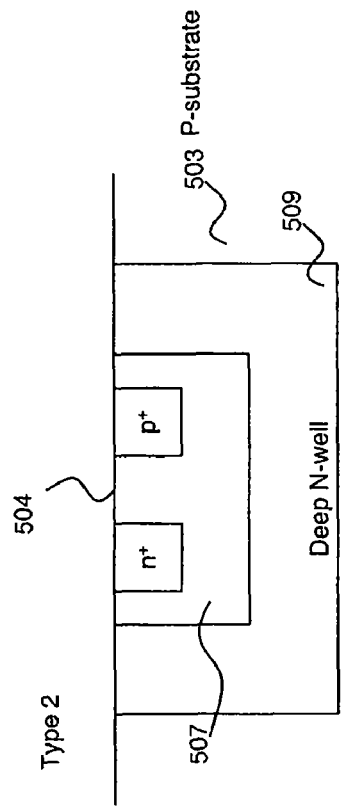
Figure 5D:
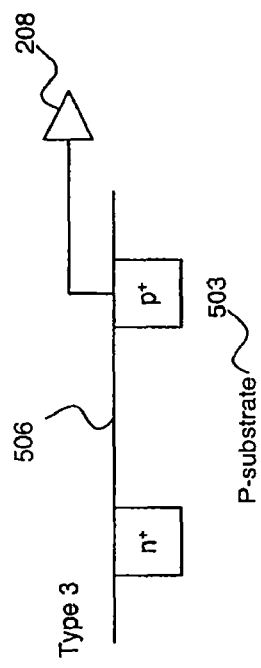

FIG. 5B-5D illustrate example implementations of diode structures for ESD protection system 510, shown in FIG. 5A. In the example of FIG. 5B, first diode structure 502 is formed as p+ in an N-well 505 on a first area of common IC P-substrate 503. In the example of FIG. 5C second diode structure 504 is formed as n+ on a second area of common IC P-substrate 507, surrounded by a deep N-well 509. In the example of FIG. 5D, third diode structure 506 is formed as n+ on first area of common IC P-substrate 503, which is coupled to ground 208.

ESD protection circuit 510 shown in FIG. 5 and the example diode structures shown in FIG. 5B-5D enable coupling multiple diodes in series on a common IC substrate coupled to ground, while allowing voltages different from ground at interconnection nodes between second diode structures 504 and third diode structure 506. Therefore, ESD protection circuit 510 provides extra headroom at terminal pad 102 when supply voltage ($V_{DD}$) 210 is relatively low.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific ICs, processors executing appropriate software and the like or any combination thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An ESD protection circuit, comprising:
   one or more first diodes coupled in series between a supply voltage and a terminal pad, each of said one or more first diodes located in a respective well on a first area of a substrate;
   a second diode coupled to a ground and sitting directly, without an intervening well, on said first area of said substrate; and
   one or more third diodes coupled in series between said terminal pad and said second diode, each of said one or more third diodes located on a respective second area of said substrate, said respective second area isolated by a respective deep well from said ground and from said first area of said substrate;
   wherein a voltage of an interconnection node between said one or more third diodes and said second diode is different than a voltage of said ground.

2. The ESD protection circuit of claim 1, wherein each of said one or more first diodes includes an n+ diffusion region and a p+ diffusion region.

3. The ESD protection circuit of claim 2, wherein said second diode includes an n+ diffusion region and a p+ diffusion region.

4. The ESD protection circuit of claim 3, wherein each of said one or more third diodes includes an n+ diffusion region and a p+ diffusion region.

5. The ESD protection circuit of claim 4, wherein said first area of said substrate is coupled to said ground.

6. The ESD protection circuit of claim 1, wherein an allowable signal swing at said terminal pad is greater than said supply voltage plus 1.4 V.

7. The ESD protection circuit of claim 1, wherein a forward turn-on voltage of said one or more first diodes, said second diode, and said one or more third diodes is approximately 0.7 V.

8. The ESD protection circuit of claim 1, wherein said ESP protection circuit increases an allowable signal swing at said terminal pad.

9. The ESD protection circuit of claim 1, wherein said respective deep well is a deep N-well.

10. The ESD protection circuit of claim 2, wherein said respective well is an N-well.

11. An ESD protection circuit, comprising:
    a substrate coupled to a ground;
    first and second diodes coupled in series and each located in a respective well on said substrate, wherein a cathode of said first diode is coupled to a supply voltage and an anode of said second diode is coupled to a terminal pad;
    a third diode on said substrate having a cathode coupled to said terminal pad, wherein said third diode is separated by a deep well from said ground; and
    a fourth diode on said substrate having a cathode coupled to an anode of said third diode and an anode coupled to said ground, wherein said fourth diode sits directly, without an intervening, well, on said substrate.

12. The ESD protection circuit of claim 11, wherein an interconnection voltage between said third diode and said fourth diode is different than a voltage of said ground.

13. The ESD protection circuit of claim 11, wherein each of said first and second diodes includes an n+ diffusion region and a p+ diffusion region.

14. The ESD protection circuit of claim 13, wherein said fourth diode includes an n+ diffusion region and a p+ diffusion region.

15. The ESD protection circuit of claim 14, wherein said third diode includes an n+ diffusion region and a p+ diffusion region isolated by said deep well from said ground.

16. The ESD protection circuit of claim 11, wherein an allowable signal swing at said terminal pad is greater than said supply voltage plus 1.4 V.

17. The ESD protection circuit of claim 11, wherein a forward turn-on voltage of said first and second diodes, said third diode, and said fourth diode is approximately 0.7 V.

18. The ESD protection circuit of claim 11, wherein said ESP protection circuit increases an allowable signal swing at said terminal pad.

19. The ESD protection circuit of claim 1, wherein said deep well is a deep N-well.

20. The ESD protection circuit of claim 13, wherein said respective well is an N-well.

* * * * *

UNITED STATES PATENT AND TRADEMARK OFFICE
CERTIFICATE OF CORRECTION

PATENT NO. : 8,110,876 B2  
APPLICATION NO. : 12/620254  
DATED : February 7, 2012  
INVENTOR(S) : Li et al.

Page 1 of 1

It is certified that error appears in the above-identified patent and that said Letters Patent is hereby corrected as shown below:

In column 6, line 8, please replace "ESP" with --ESD--.
In column 6, line 27, please replace "intervening," with --intervening--.
In column 6, line 47, please replace "ESP" with --ESD--.

Signed and Sealed this
Eighth Day of May, 2012

David J. Kappos
*Director of the United States Patent and Trademark Office*